(12) United States Patent
Patterson

(10) Patent No.: US 6,184,046 B1
(45) Date of Patent: Feb. 6, 2001

(54) NON-CONTACT VOLTAGE STRESSING METHOD FOR THIN DIELECTRICS AT THE WAFER LEVEL

(75) Inventor: Joe Patterson, Mission Viejo, CA (US)

(73) Assignee: Texas Instruments Incorporated, Dallas, TX (US)

( * ) Notice: Under 35 U.S.C. 154(b), the term of this patent shall be extended for 0 days.

(21) Appl. No.: 08/985,660

(22) Filed: Dec. 9, 1997

(51) Int. Cl.$^7$ .................................................. H01L 21/66
(52) U.S. Cl. .............................. 438/14; 438/17; 324/537; 324/750; 324/752
(58) Field of Search ................................ 324/537, 750, 324/751, 752, 753; 438/14, 17

(56) References Cited

U.S. PATENT DOCUMENTS

| | | | | |
|---|---|---|---|---|
| 4,967,152 | * | 10/1990 | Patterson | 324/752 |
| 5,030,908 | * | 7/1991 | Miyoshi et al. | 324/752 |
| 5,150,043 | * | 9/1992 | Flesner | 324/752 |
| 5,508,627 | * | 4/1996 | Patterson | 324/751 |
| 5,963,783 | * | 10/1999 | Lowell et al. | 438/17 |

* cited by examiner

*Primary Examiner*—Kevin M Picardt
(74) *Attorney, Agent, or Firm*—W. Daniel Swayze, Jr.; Wade James Brady III; Frederick J. Telecky, Jr.

(57) ABSTRACT

A test apparatus and method that is used for a stress test of a semiconductor device.

10 Claims, 3 Drawing Sheets

NON-CONTACT VOLTAGE STRESSING METHOD FOR THIN DIELECTRICS AT THE WAFER LEVEL

FIELD OF THE INVENTION

The present invention relates to a test apparatus and methodology and more particularly to a test apparatus for performing a non-contact voltage stress test of a semiconductor device in wafer form.

BACKGROUND ART

Semiconductor chips are widely used for many functions in today's electronic world. These semiconductor chips are produced from wafers in a semiconductor manufacturing process. As the final steps of the semiconductor manufacturing process are occurring, a plurality of final test steps are required in order to prevent defective chips from reaching the user. A probe test is a typical test step of this type. In this probe test, a probe test apparatus is used in that probes are brought into physical contact with all of electrical pads of one chip of a large number of semiconductor chips on the semiconductor wafer. A signal pattern is then applied to each of the semiconductor chips by using the probe test apparatus, and an output from each chip is monitored thereby testing the electrical characteristics of each semiconductor chip. With this probe test apparatus, and in order to test all the chips on the semiconductor wafer, a wafer chuck on which the semiconductor wafer is held must be vertically moved up and down and stepped by a distance corresponding to one chip every time a test on one chip is completed.

As the final steps of the semiconductor manufacturing process is completed, a marking step, and a repair step sometimes is performed in addition to the probe test step. In the marking step, a chip determined as a defective chip by the probe test is marked by using ink or the like. In the repair step, a repairable defective chip is repaired. Furthermore as a final test step, a visual test step may be required in which the semiconductor chips on the semiconductor wafer are magnified and visually observed.

As another final test step of the semiconductor manufacturing process, a burn in test is conducted in addition to the above probe test. In that burn in test, semiconductors chips are driven to a state similar to an actual driven state while temperatures and/or voltages stresses are applied to the semiconductor chips thereby finding semiconductor chips which are subject to infant failures of the semiconductor devices manufactured by using the chips. In these conventional systems, this burn in test is not conducted on the semiconductor chip on the semiconductor wafer but is conducted on each of the semiconductor devices obtained by cutting a semiconductor wafer into chips and packaging them at this point more cost has been invested.

A disadvantage of the probe test is that in fact a probe is required to touch the semiconductor wafer. This physical contact with the semiconductor wafer generates particles and the associated damage.

The particles are mainly a problem if probing is attempted on in-process wafers before passivation, especially after an early step like after polysilicon patterning. Therefore, non-contact voltage stressing at these early steps in wafer processing is very advantages or necessary.

SUMMARY OF THE INVENTION

The present invention provides a method and apparatus to voltage stress semiconductor wafers without using mechanical or physical contact. The present invention correspondingly generates no or few particles and the corresponding damage.

The present invention uses a grid which is substantially invisible to ultra violet light. This grid is suspended over the semiconductor wafer and avoids physical contact with the semiconductor wafer. A light source is energized to generate a beam of light, and this light is directed to pass through the grid and to the semiconductor wafer. The grid is constructed to be transparent to the light. The grid is energized to a predetermined voltage, and as a consequence defects for example gate oxide defects are stressed and made thereby detectable.

The method can be implemented several ways:

1) The UV/voltage stressing is performed after polysilicon patterning and no observation or defect determination is made until normal wafer electrical test probing. Die with defects induced by the UV/voltage stress result in failure are inked and rejected.

2) A special mask step is introduced before the normal polysilicon patterning that only removes polysilicon from the scribe lines. Thus leaving individual isolated field plates the size of the die. The UV/voltage stressing is then performed. Again no observation or defect determination is made until the normal wafer electrical test probing.

3) The UV/voltage stressing is performed while the wafer is examined with a light emission microscope. Defects emit light and are detected real-time. The applied voltage can be ramped up and defects that show up at different voltages can be identified. This stressing can be of much shorter duration than "1" and "2" above. Defects are observed before they degrade to the point of causing failure. The additional advantage is that defects that would not normally result in failure for the life of the units are not degraded such that they then will result in failure during product use.

Additional objects and advantages of the present invention will be set forth in the description which follows and in part will be obvious from the description or may be learned by practice of the present invention. The objects and advantages of the present invention may be realized and obtained by means of the instrumalities and combinations particularly pointed out in the attached claims.

DETAILED DESCRIPTION OF THE PRESENT INVENTION

Figure 1:
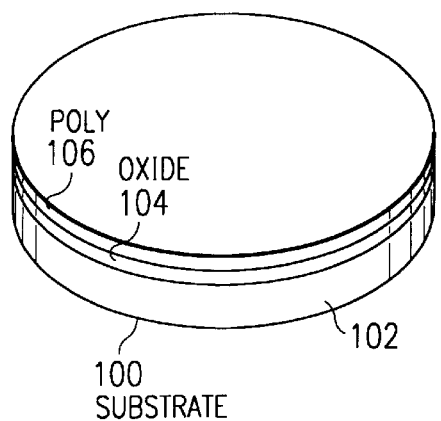
FIG. 1 illustrates a semiconductor wafer.

FIG. 1 illustrates a semiconductor wafer to be used in conjunction with the present invention. The semiconductor wafer 100 includes a substrate 102. The substrate 102 is adjacent to an oxide coating layer 104. The oxide coating layer 104 is coated with polysilicon 106, which protects the oxide coating layer 104 used to form the assembly 120. The oxide 104 may include defects for example gate oxide defects which is detectable by voltage stressing as in the present invention. The gate oxide defects are present in a dielectric of a capacitor structure which may be part of an active transistor.

Figure 2:
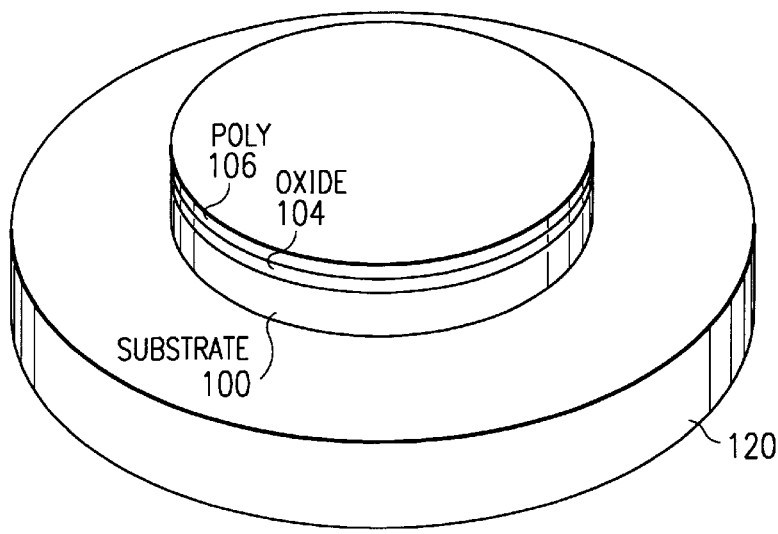
FIG. 2 illustrates a mounted semiconductor wafer.

As illustrated in FIG. 2, the wafer 100 is mounted on assembly 120 to provide an electrical connection for the grid and to ground the back of the substrate of the wafer as well as provide a secure position for the wafer 100. A chuck may be used to form the assembly 120, but a metal conductor would be equally sufficient.

Figure 3:
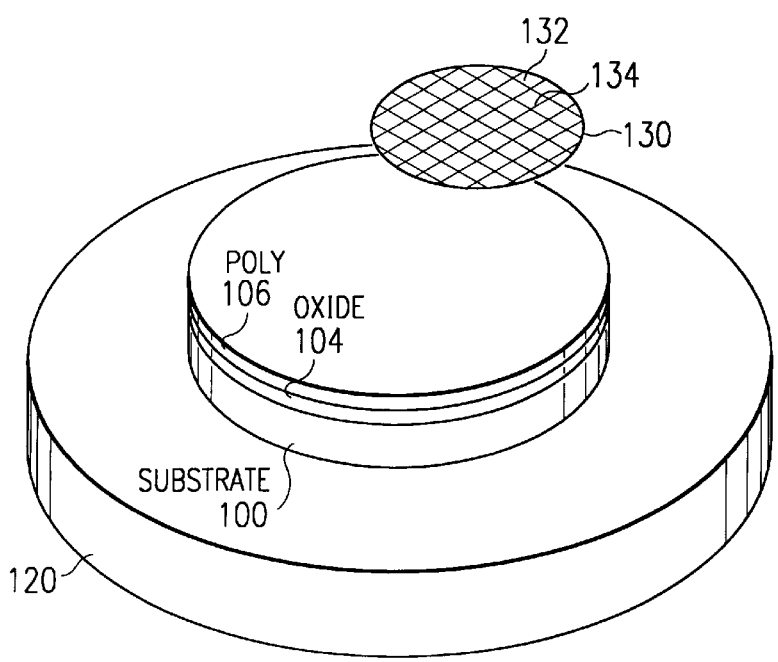
FIG. 3 illustrates a grid with the mounted semiconductor wafer.
Figure 4:
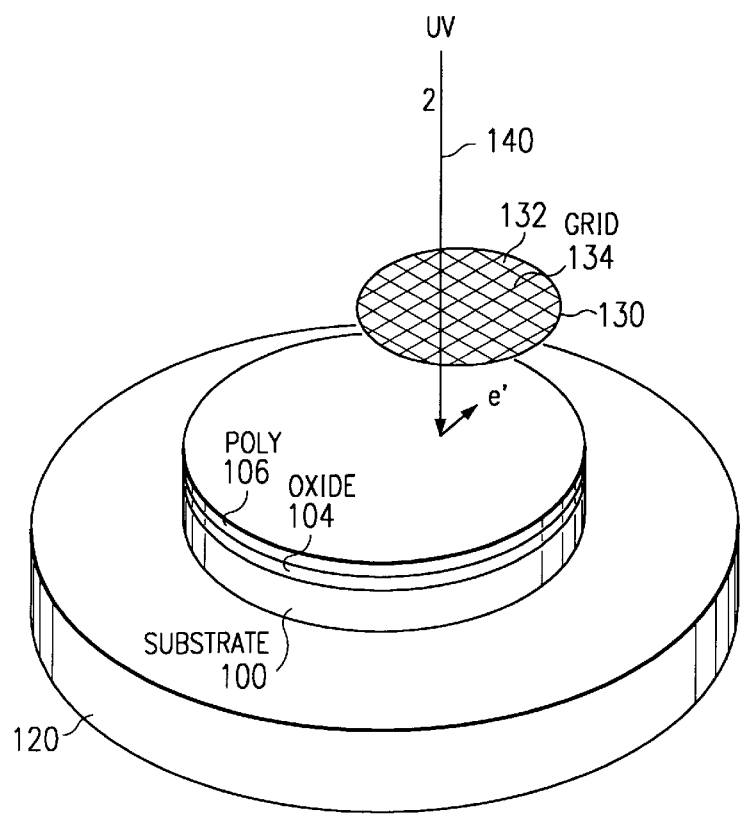
FIG. 4 illustrates ultra violet light radiating through the grid.
Figure 5:
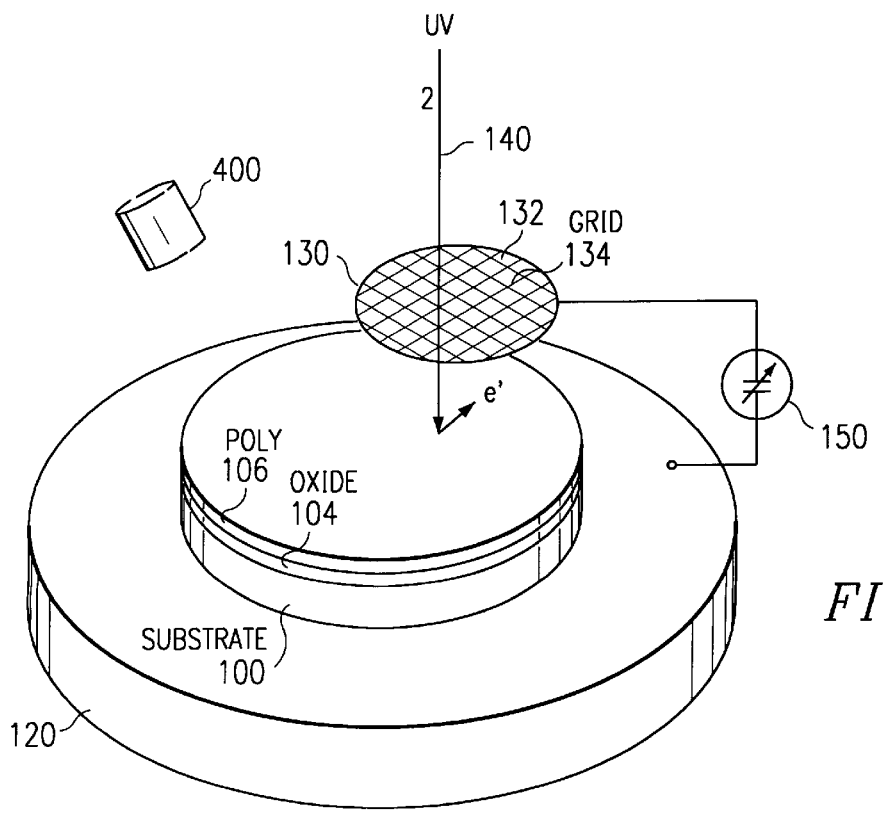
FIG. 5 illustrates the grid with a potential.

As illustrated in FIG. 3, a grid 130 is placed over the polysilicon layer 106. The grid is spaced a few millimeters, approximately 5 mm over the outer surface of the polysilicon layer 106.

The grid 130 includes intersecting grid members 132 and 134. The grid member 132 may be perpendicular to grid member 134; however, other designs and orientation of grid member 132 and grid member 134 are possible. The grid 130 should be substantially transparent to the light being used to irradiate the surface of the polysilicon 106. Typically, the grid 130 should only obscure approximately 5% of the light or less. The grid 130 may be constructed of glass for example fused silica quartz that would transmit, for example, ultra violet light through it and could have a metallized film on the bottom that is sufficiently thin to allow the ultra violet light to pass through the grid without significant absorption. This metallurgical film allows for an electrical connection to a voltage source and forms a parallel plate configuration with the wafer being the other plate.

The grid 130 could be alternatively constructed from magnesium fluoride or sapphire as the substrate.

Ultra violet light is transmitted to the polysilicon 106 through the grid 130. A beam of the ultra violet light 104 radiates from a source ("not shown") Typically, the wave length of the ultra violet light is sufficiently short such that its energy is greater than the work function of the material being examined in this embodiment polysilicon 106. Usually, the wavelength should be below 300 nanometers. Additionally, a range of 200–275 nanometers may be applied with 250 nanometers being used in one embodiment of the present invention.

The grid is energized to a pre-determined voltage. The pre-determined voltage set by voltage source 150 could be 5 volts. The present invention detects defects in any dielectric formed within gate oxide. The defect may occur in the dielectric of capacitors formed from the oxide 106. Also, dielectric of active transistors may be examined for defects.

Since the detection of defects are performed after the processing of oxide 106, and since the circuits have now been formed in the polysilicon layer 106, there is no need to perform burn-in stressing (for dielectric defect) since the defect has been made electrically active and should fail during normal probe testing device 400.

As to the particular voltage, the thickness of the dielectric being stressed affects the selection of the voltage applied to the grid 130. The voltage should be less than the intrinsic breakdown voltage of the dielectric if it was defect free.

The light is energized for a predetermined period of time. The period of time that the light is energized determines the duration of voltage across the dielectric.

The output from the monitoring device 400 may be used with a figure of merit to determine the severity of the defect. This figure of merit may use a gray scale of the variation of light to establish pass or reject criteria.

The wafer is monitored by the monitoring device 400 for example a light emission microscope. The monitoring device 400 may have a filter to remove the effects of the ultra violet light. Thus, sights that have electrical leakage or shorts, emit light, which indicate the location where current is going through the dielectric, thus identifies a defect in the wafer. This process needs to be performed in a rough vacuum for example below 1000 Millitorr. Typical experiments have been run in the range of 10–300 Millitorr. The vacuum allows electrons ejected from the wafer to reach the grid.

Figure 6:
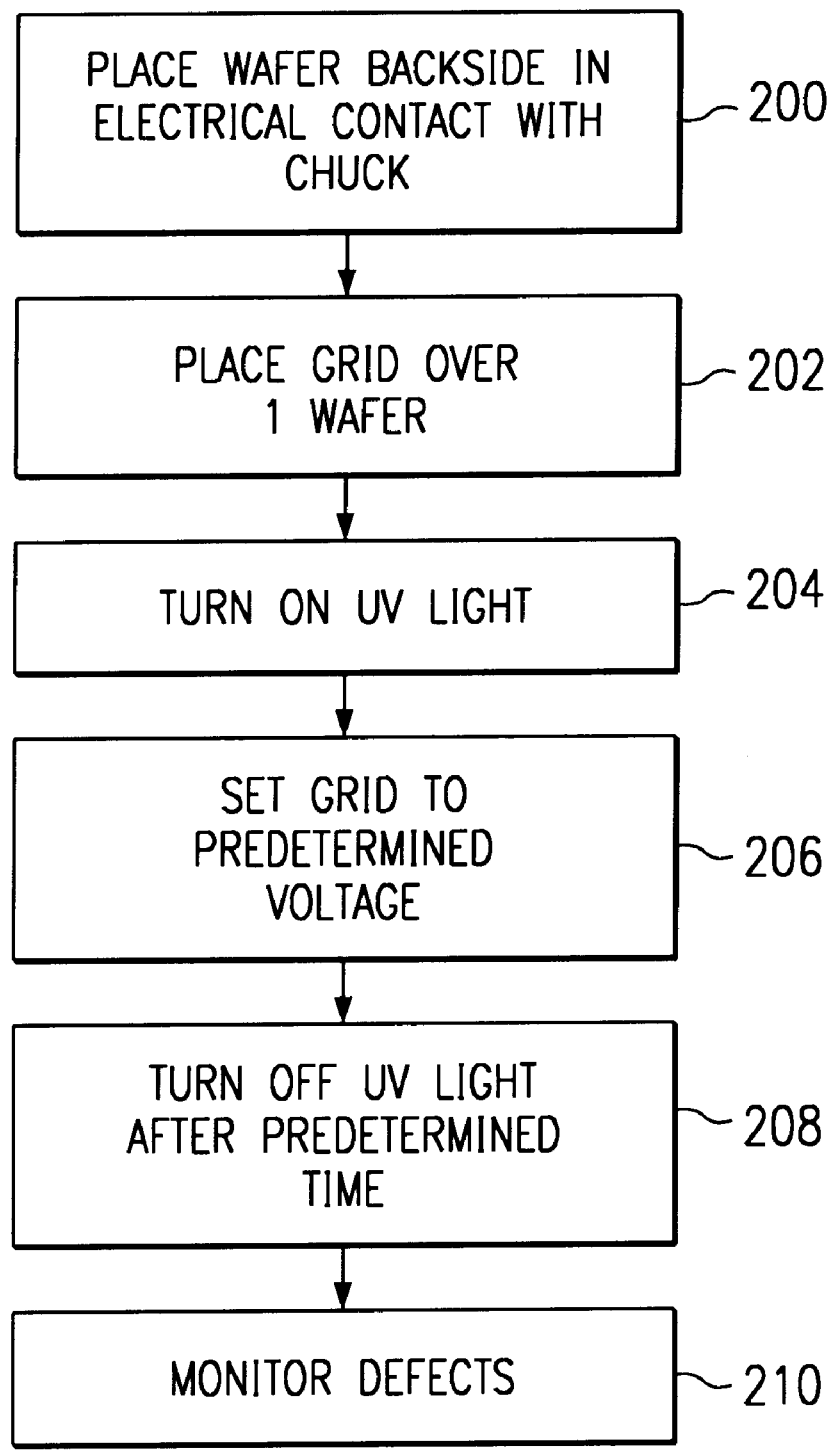
FIG. 6 illustrates a method of the present invention.

Turning now to FIG. 6, this figure shows the process of the invention. At step 200, the wafer backside is placed in electrical contact with the chuck which has been connected to ground. At step 202, a grid is placed over the wafer. At step 204, the UV light is turned on. At step 206, the grid is set to a pre-determined voltage, or ramped up from a lower to a higher voltage. Monitoring with the light emission microscope is conducted with the UV light on. At step 208, the UV light is turned off at a pre-determined time for example five minutes. The time is determined by the oxide thickness, the applied voltage and the accept/reject criteria. Lastly, at step 210, defects are detected during normal wafer probing after fabrication is completed.

Additional advantages of modification will ready occur to those skilled in the art. Therefore, the invention in its broader aspects is not limited to the specific details and representative devices shown and described herein. Accordingly, various modifications may be made without departing from the spirit or scope of the general invention concept as defined by the attached claims in their equivalents.

What is claimed is:

1. A device for measuring a defect, comprising:

a semiconductor wafer;

a grid positioned over said semiconductor wafer;

said grid being bias with a voltage with respect to said semiconductor wafer;

a light source for generating a light beam directed through the grid on said semiconductor wafer;

a monitoring device responding to said light on said semiconductor wafer and said voltage to detect said defect.

2. A device for measuring a defect as in claim 1, wherein:

said light source is an ultra violet light source.

3. A device for measuring a defect in claim 1, wherein:

said monitoring device determines the location of defect.

4. A device for measuring a defect as in claim 3, whereby:

said severity of defect is determined by a figure of merit.

5. A device for measuring a defect as in claim 4, whereby:

said severity of defect is determined by a gray scale.

6. A system for measuring a defect, comprising:

a semiconductor wafer;

a grid positioned over said semiconductor wafer;

said grid being bias with a voltage with respect to said semiconductor wafer;

a light source for generating a light beam directed through the grid on said semiconductor wafer;

a monitoring device responding to said light on said semiconductor wafer and said voltage to detect said defect.

7. A system for measuring a defect as in claim 1, whereby:

said light source is an ultra violet light source.

8. A system for measuring a defect in claim 1, wherein:

said monitoring device determines the type of defect.

9. A system for measuring a defect as in claim 3, whereby:

said security of defect is determined by a figure of merit.

10. A system for measuring a defect as in claim 4, whereby:

said security of defect is determined by a gray scale.

* * * * *